US012628404B2

(12) United States Patent
Myung et al.

(10) Patent No.: US 12,628,404 B2
(45) Date of Patent: May 12, 2026

(54) SEMICONDUCTOR DEVICE

(71) Applicant: Samsung Electronics Co., Ltd.,
Suwon-si (KR)

(72) Inventors: Taehun Myung, Goyang-si (KR); Yuri Masuoka, Seongnam-si (KR); Kihwang Son, Seongnam-si (KR); Jaehun Jeong, Hwaseong-si (KR); Seulki Park, Hwaseong-si (KR); Joongwon Jeon, Suwon-si (KR); Kyunghoon Jung, Seoul (KR); Yonghyun Ko, Hwaseong-si (KR); Seungwook Lee, Hwaseong-si (KR)

(73) Assignee: Samsung Electronics Co., Ltd.,
Suwon-si (KR)

(*) Notice: Subject to any disclaimer, the term of this patent is extended or adjusted under 35 U.S.C. 154(b) by 553 days.

(21) Appl. No.: 18/181,071

(22) Filed: Mar. 9, 2023

(65) Prior Publication Data

US 2023/0290838 A1 Sep. 14, 2023

(30) Foreign Application Priority Data

Mar. 10, 2022 (KR) ........................ 10-2022-0030325

(51) Int. Cl.
H10D 64/00 (2025.01)
H10D 30/62 (2025.01)
(52) U.S. Cl.
CPC ....... H10D 64/115 (2025.01); H10D 30/6211 (2025.01); H10D 30/6219 (2025.01)
(58) Field of Classification Search
None
See application file for complete search history.

(56) References Cited

U.S. PATENT DOCUMENTS

| | | | |
|---|---|---|---|
| 7,951,704 B2 | 5/2011 | Fang et al. | |
| 9,331,199 B2 | 5/2016 | Cho et al. | |
| 9,349,818 B2 | 5/2016 | Yu et al. | |
| 9,559,186 B2 | 1/2017 | Tsai et al. | |
| 9,653,558 B2 | 5/2017 | Hsiao et al. | |
| 10,923,420 B2 | 2/2021 | Oh et al. | |
| 11,081,403 B2 | 8/2021 | Lin et al. | |

(Continued)

FOREIGN PATENT DOCUMENTS

JP 2010073858 A * 4/2010

OTHER PUBLICATIONS

English translation of JP 2010-73858 (Year: 2010).*

*Primary Examiner* — Xiaoming Liu
(74) *Attorney, Agent, or Firm* — Fish & Richardson P.C.

(57) ABSTRACT

A semiconductor device includes a substrate including an active region, a first gate line and a second gate line in the active region, a first source/drain contact pattern in the active region at one side of the first gate line, a second source/drain contact pattern in the active region at one side of the second gate line, and a dummy source/drain contact pattern in the active region between the first gate line and the second gate line. The first gate line and the second gate line may be spaced apart from each other in the first direction and may extend in the second direction. The second direction may cross the first direction. A size of the dummy source/drain contact pattern may be less than a size of the first source/drain contact pattern and a size of the second source/drain contact pattern.

20 Claims, 18 Drawing Sheets

EX9

(56)      References Cited

U.S. PATENT DOCUMENTS

2016/0013129  A1      1/2016   Soh et al.
2019/0198491  A1      6/2019   Do et al.
2021/0134790  A1      5/2021   Lu et al.

* cited by examiner

SEMICONDUCTOR DEVICE

CROSS-REFERENCE TO RELATED APPLICATION

This application is based on and claims priority under 35 U.S.C. § 119 to Korean Patent Application No. 10-2022-0030325, filed on Mar. 10, 2022, in the Korean Intellectual Property Office, the disclosure of which is incorporated by reference herein in its entirety.

BACKGROUND

Inventive concepts relate to a semiconductor device, and more particularly, to a semiconductor device with improved device performance.

In line with the miniaturization of semiconductor devices, patterns included in the semiconductor devices have gradually been miniaturized. When manufacturing a semiconductor device, a micro-patterning process for forming micro-patterning becomes increasingly difficult. Accordingly, there may be a need for a method for overcoming difficulties in the micro-patterning process and improving the device performance of miniaturized semiconductor devices.

SUMMARY

Inventive concepts provide a semiconductor device with improved device performance.

According to an example embodiment of inventive concepts, a semiconductor device may include a substrate including an active region in a substrate; a first gate line and a second gate line in the active region, the first gate line and the second gate line being spaced apart from each other in a first direction and extending in a second direction, the second direction crossing the first direction; a first source/drain contact pattern in the active region at one side of the first gate line; a second source/drain contact pattern in the active region at one side of the second gate line; and a dummy source/drain contact pattern in the active region between the first gate line and the second gate line. A size of the dummy source/drain contact pattern may be less than a size of the first source/drain contact pattern and a size of the second source/drain contact pattern.

According to an example embodiment of inventive concepts, a semiconductor device may include a substrate including an active region having a first region width in a first direction and a first region length in a second direction, the second direction perpendicular to the first direction, the active region including a first active contact region, a second active contact region, and a dummy contact region between the first active contact region and the second active contact region; a first gate line and a second gate line extending in the second direction in the active region, the second gate line spaced apart from the first gate line in the first direction, the first gate line and the second gate line in the active region with the first active contact region at one side of the first gate line, the second active contact region at one side of the second gate line, and the dummy contact region between the first gate line and the second gate line; a first source/drain contact pattern in the first active contact region, the first source/drain contact pattern being spaced apart from the first gate line in the first direction; and a second source/drain contact pattern in the second active contact region, the second source drain/contact pattern being spaced apart from the second gate line in the first direction.

According to another example embodiment of inventive concepts, a semiconductor device may include a substrate including an active region, the active region including a first active contact region, a second active contact region, and a plurality of dummy contact regions in the active region; a plurality of gate lines spaced apart from each other in a first direction in the active region, the plurality of gate lines extending in a second direction perpendicular to the first direction in the active region, the plurality of gate lines including a first gate line and a second gate line, the plurality of gate lines in the active region with the first active contact region disposed at one side of the first gate line and the second active contact region at one side of the second gate line, and the plurality of dummy contact regions in the active region between the plurality of gate lines; a first source/drain contact pattern in the first active contact region; a second source/drain contact pattern in the second active contact region; and a plurality of dummy source/drain contact patterns in at least one of the plurality of dummy contact regions. Sizes of the plurality of dummy source/drain contact patterns may be less than a size of the first source/drain contact pattern and a size the second source/drain contact pattern.

BRIEF DESCRIPTION OF THE DRAWINGS

Embodiments of inventive concepts will be more clearly understood from the following detailed description taken in conjunction with the accompanying drawings in which:

FIG. 13 is a plan view of a semiconductor device according to an embodiment of inventive concepts;

DETAILED DESCRIPTION

Hereinafter, example embodiments of inventive concepts are described in detail with reference to the accompanying drawings. The following embodiments of inventive concepts may be implemented by only one or may also be implemented by combining one or more thereof. Accordingly, features and aspects of inventive concepts are not to be construed as being limited to one embodiment.

Figure 1:
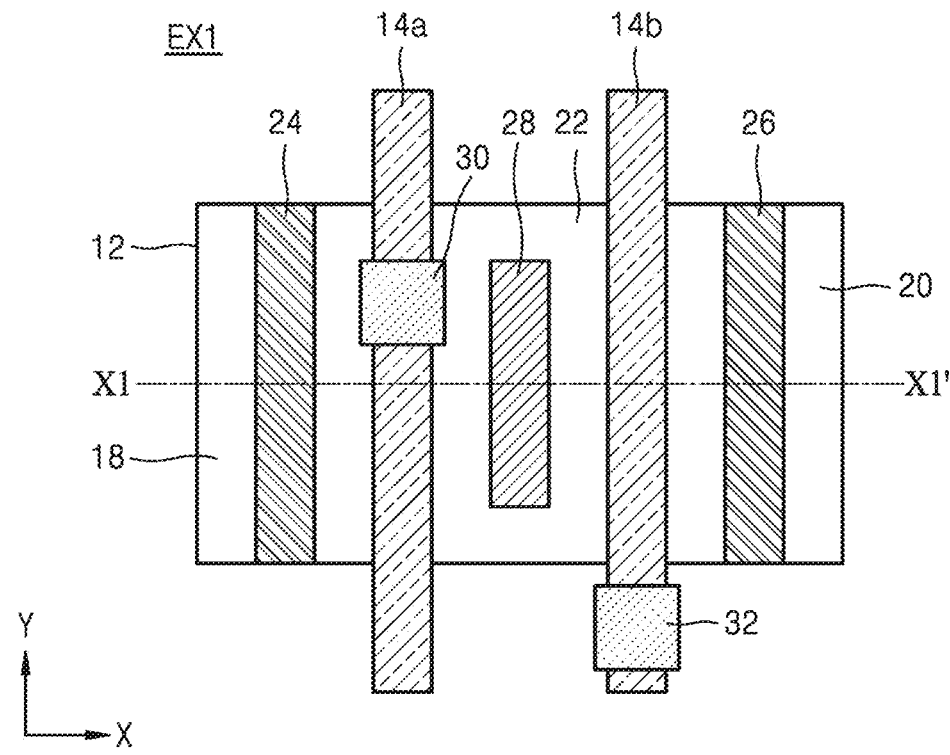
FIGS. 1 and 2 are plan views of a semiconductor device according to an embodiment of inventive concepts.
Figure 2:
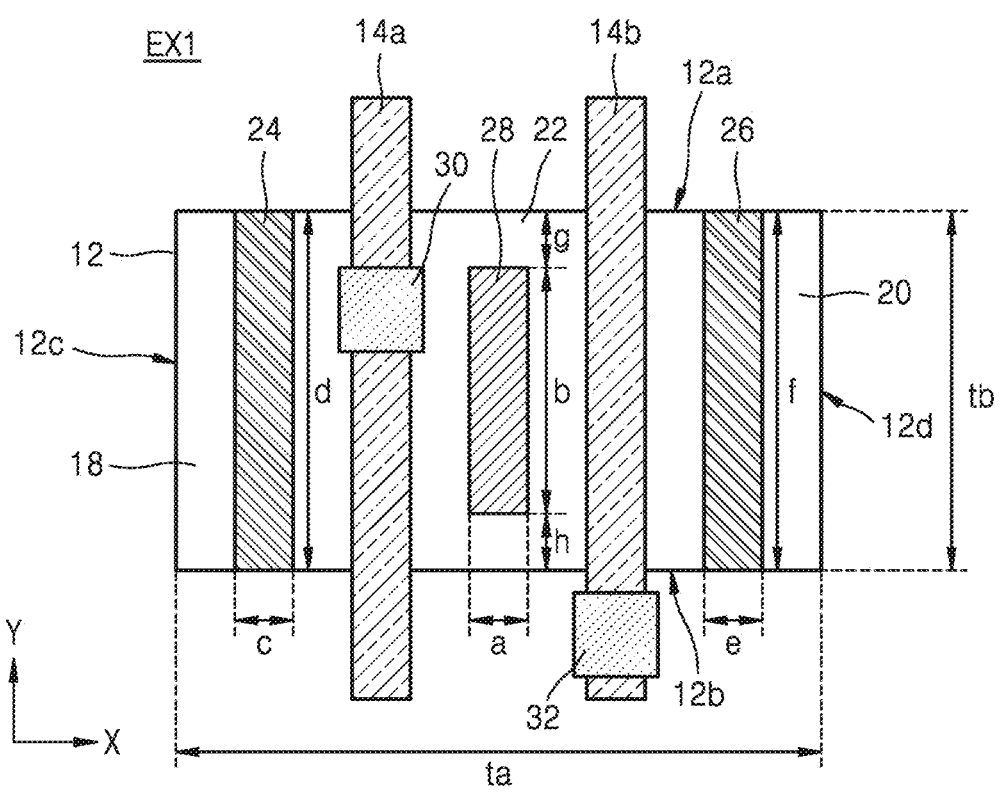

FIGS. 1 and 2 are plan views of a semiconductor device according to an embodiment of inventive concepts.

In an embodiment, a semiconductor device EX1 may include an active region (or active area) 12 in a substrate (sb in FIG. 3), a first gate line 14$a$, a second gate line 14$b$, a first source/drain contact pattern 24, a second source/drain contact pattern 26, and a dummy source drain contact pattern 28. A source/drain may refer to a source or a drain.

The semiconductor device EX1 may be an integrated circuit device. The semiconductor device EX1 may be a metal oxide silicon (MOS) transistor. The semiconductor device EX1 may be a PMOS transistor or an NMOS transistor. The semiconductor device EX1 may be a field effect transistor (FET).

The active region 12 may be a region in which an active device is formed. The active region 12 may have a first region width to in a first direction (an X direction) and a first region length tb in a second direction (a Y direction) perpendicular to the first direction (the X direction). Portions other than the active region 12 may be non-active regions (or non-active areas 8 and 10 of FIG. 3). The non-active regions (8 and 10 in FIG. 3) may be referred to as device isolation regions or field regions.

The first gate line 14$a$ extends in the second direction (the Y direction) in the active region 12. A first gate contact pattern 30 may be disposed on the first gate line 14$a$. The second gate line 14$b$ is disposed in the active region 12 and spaced apart from the first gate line 14$a$ in the first direction (the X direction).

A second gate contact pattern 32 may be disposed on the second gate line 14$b$. The second gate line 14$b$ extends in the second direction (the Y direction). The first gate line 14$a$ and the second gate line 14$b$ may also be disposed outside the active region 12, that is, in the non-active region.

According to the arrangement of the first gate line 14$a$ and the second gate line 14$b$, the active region 12 may be classified as a first active contact region 18, a second active contact region 20, and a dummy contact region 22. The first active contact region 18 may be disposed in the active region 12 at one side of the first gate line 14$a$. The second active contact region 20 may be disposed in the active region 12 at one side of the second gate line 14$b$. The dummy contact region 22 may be disposed in the active region 12 between the first gate line 14$a$ and the second gate line 14$b$.

The first active contact region 18 may be a first source/drain region. The second active contact region 20 may be a second source/drain region. The dummy contact region 22 may be a dummy source/drain region.

The first source/drain contact pattern 24 is disposed in the active region 12 at one side of the first gate line 14$a$. The first source/drain contact pattern 24 may be disposed in the first active contact region 18. The first source/drain contact pattern 24 is apart from the first gate line 14$a$ in the first direction (the X direction). The first source/drain contact pattern 24 is apart from one edge 12$c$ of the active region 12 in the first direction (the X direction).

The second source/drain contact pattern 26 is disposed in the active region 12 at one side of the second gate line 14$b$.

The second source/drain contact pattern 26 may be disposed in the second active contact region 20. The second source/drain contact pattern 26 is apart from the second gate line 14$b$ in the first direction (the X direction). The second source/drain contact pattern 26 is apart from one edge 12$d$ of the active region 12 in the first direction (–X direction).

The dummy source/drain contact pattern 28 is disposed in the active region 12 between the first gate line 14$a$ and the second gate line 14$b$. The semiconductor device EX1 may have a symmetrical structure in the first direction (the X direction) with respect to the dummy source/drain contact pattern 28. The dummy source/drain contact pattern 28 may be disposed in the dummy contact region 22.

The dummy source/drain contact pattern 28 is apart from one edge 12$a$ of the active region 12 by a first spacing distance g in the second direction (–Y direction). The dummy source/drain contact pattern 28 is apart from the other edge 12$b$ of the active region 12 by a second spacing distance h in the second direction (the Y direction).

The dummy source/drain contact pattern 28 may have a smaller size than the first source/drain contact pattern 24 and the second source/drain contact pattern 26. The size may refer to the width, length, or area of a pattern. Here, the sizes of the first source/drain contact pattern 24, the second source/drain contact pattern 26, and the dummy source/drain contact pattern 28 are described in detail.

The dummy source/drain contact pattern 28 may have a first pattern width a in the first direction (the X direction) and a first pattern length b in the second direction (the Y direction). The first source/drain contact pattern 24 may have a second pattern width c in the first direction (the X direction) and a second pattern length d in the second direction (the Y direction). The second source/drain contact pattern 26 may have a third pattern width e in the first direction (the X direction) and a third pattern length f in the second direction (the Y direction). The second pattern length d of the first source/drain contact pattern 24 and the third pattern length f of the second source/drain contact pattern 26 may be equal to the first region length tb of the active region 12.

In some embodiments, the first pattern width a, the first pattern length b, the second pattern width c, the second pattern length d, the third pattern width e, and the third pattern length f may have a size of a few nanometers (nm) to tens of nanometers (nm).

The first pattern width a of the dummy source/drain contact pattern 28 may be equal to the second pattern width c of the first source/drain contact pattern 24 in the first direction (the X direction) and the third pattern width e of the second source/drain contact pattern 26 in the first direction (the X direction).

The first pattern length b of the dummy source/drain contact pattern 28 may be less than the second pattern length d of the first source/drain contact pattern 24 in the second direction (the Y direction) and the third pattern length f of the second source/drain contact pattern 26 in the second direction (the Y direction). The first pattern length b of the dummy source/drain contact pattern 28 may be less than the first region length tb of the active region 12.

As described above, in the semiconductor device EX1, the first pattern length b of the dummy source/drain contact pattern 28 is configured to be less than the second pattern length d of the first source/drain contact pattern 24 and the third pattern length f of the second source/drain contact pattern 26.

Accordingly, in the semiconductor device EX1, damage to the active region 12 below the dummy source/drain contact pattern 28, for example, the dummy source/drain region, may be limited and/or suppressed. As a result, in the semiconductor device EX1, device resistance between the first source/drain contact pattern 24 and the second source/drain contact pattern 26 may be reduced during a device operation, thereby improving device performance.

Figure 3:
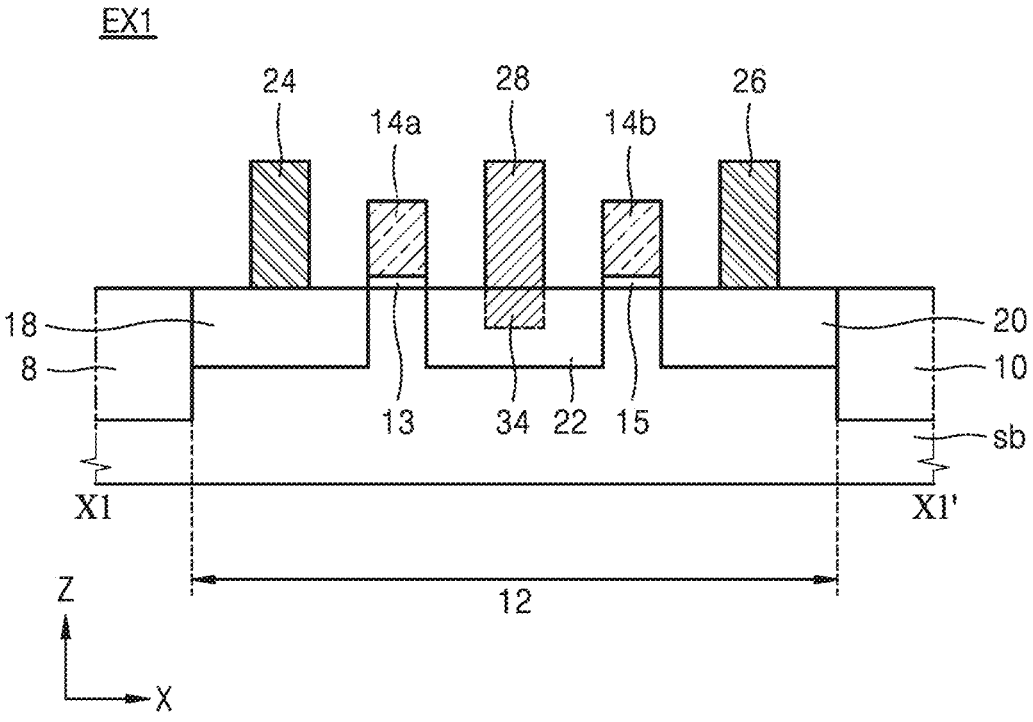
FIG. 3 is a cross-sectional view of a semiconductor device according to an embodiment of inventive concepts.
Figure 4:
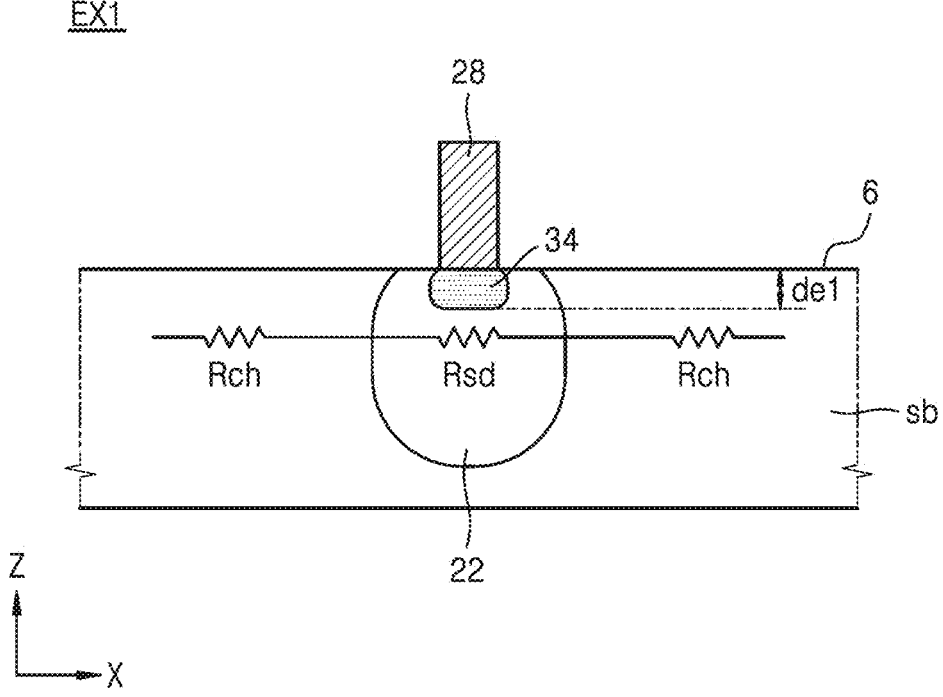
FIG. 4 is a diagram illustrating device resistance of the semiconductor device of FIG. 3.

FIG. 3 is a cross-sectional view of the semiconductor device EX1 according to an embodiment of inventive concepts, and FIG. 4 is a diagram illustrating device resistance of the semiconductor device EX1 of FIG. 3.

In an embodiment, the semiconductor device EX1 may be a cross-sectional view taken along line X1-X1' of FIG. 1. In FIGS. 3 and 4, the same reference numerals as those of FIGS. 1 and 2 denote the same members. In FIGS. 3 and 4, the same description as that of FIGS. 1 and 2 is briefly given or omitted.

The semiconductor device EX1 may be a planar transistor and may be formed by a gate first process. Accordingly, in the semiconductor device EX1, a first gate insulating layer 13 and a second gate insulating layer 15 may be formed below the first gate line 14a and the second gate line 14b, respectively.

In more detail, the semiconductor device EX1 may include the active region 12 and the non-active regions 8 and 10 formed in the substrate sb. The non-active regions 8 and 10 may include a first non-active region 8 and a second non-active region 10. A substrate sb may include one or more semiconductor materials selected from the group consisting of Si, Ge, SiGe, GaP, GaAs, SiC, SiGeC, InAs, and InP. The active region 12 may include the same material as that of the substrate sb. The active region 12 may be defined by forming the first and second non-active regions 8 and 10 on the substrate sb. The first and second non-active regions 8 and 10 may be insulating regions. The first and second non-active regions 8 and 10 may be trench isolation regions.

The first gate line 14a and the second gate line 14b may be formed in the active region 12 of the substrate sb. The first gate line 14a and the second gate line 14b may be referred to as planar gate lines formed on the substrate Sb. The first gate line 14a and the second gate line 14b may include a metal, such as W or TiN. The second gate line 14b is apart from the first gate line 14a in the first direction (the X direction). The first gate insulating layer 13 may be formed below the first gate line 14a. The second gate insulating layer 15 may be formed below the second gate line 14b.

The first active contact region 18 may be formed in the active region 12 of the substrate sb at one side of the first gate line 14a. The first active contact region 18 may be a first source/drain region. The first source/drain region may be an impurity-doped region in which the substrate sb is doped with impurities.

The second active contact region 20 may be formed in the active region 12 of the substrate sb at one side of the second gate line 14b. The second active contact region 20 may be a second source/drain region. The second source/drain region may be an impurity-doped region in which the substrate sb is doped with impurities.

The dummy contact region 22 may be formed in the active region 12 of the substrate sb between the first gate line 14a and the second gate line 14b. The dummy contact region 22 may be a dummy source/drain region. The dummy source/drain region may be an impurity-doped region in which the substrate sb is doped with impurities.

The first source/drain contact pattern 24 may be formed in the first active contact region 18. In other words, the first source/drain contact pattern 24 may be formed in the first active contact region 18 to be apart from the first gate line 14a.

The second source/drain contact pattern 26 may be formed on the second active contact region 20. In other words, the second source/drain contact pattern 26 may be formed in the second active contact region 20 to be apart from the second gate line 14b. The dummy source/drain contact pattern 28 may be formed in the dummy contact region 22.

When the dummy source/drain contact pattern 28 is formed to manufacture the semiconductor device EX1, the dummy contact region 22 may be damaged to form a dummy source/drain loss region 34. The dummy source/drain loss region 34 may have a depth del from a surface 6 of the substrate sb, as shown in FIG. 4.

As described above, the dummy source/drain contact pattern 28 of the semiconductor device EX1 of inventive concepts may have a smaller size than the first source/drain contact pattern 24 and the second source/drain contact pattern 26. Accordingly, as shown in FIG. 4, in the semiconductor device EX1 of inventive concepts, the size of the dummy source/drain loss region 34 may be reduced to reduce resistance Rsd of the dummy contact region 22. The resistance Rsd of the dummy contact region 22 may be connected to channel resistance Rch.

As a result, in the semiconductor device EX1 according to embodiments of inventive concepts, device resistance between the first active contact region 18 (or the first source/drain region) and the second active contact region 20 (or the second source/drain region) may be reduced during a device operation.

Figure 5:
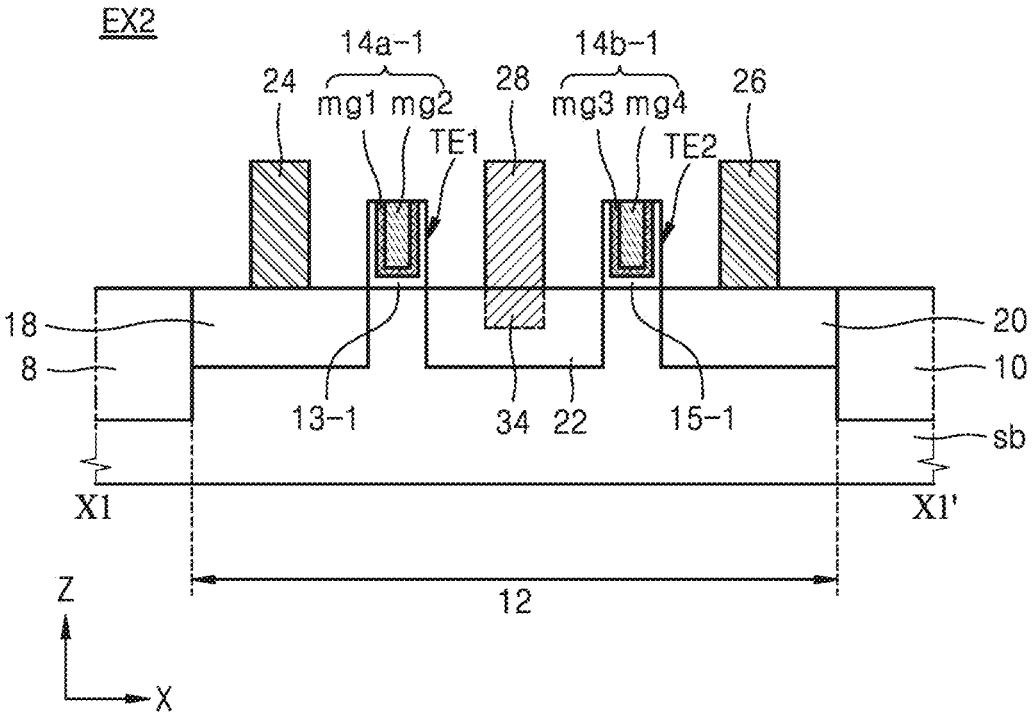
FIG. 5 is a cross-sectional view of a semiconductor device according to an embodiment of inventive concepts.

FIG. 5 is a cross-sectional view of a semiconductor device EX2 according to an embodiment of inventive concepts.

In an embodiment, the semiconductor device EX2 may be the same as the semiconductor device EX1 of FIG. 3, except that structures of a first gate line 14a-1 and a second gate line 14b-1 are different from those in the semiconductor device EX1 of FIG. 3. The semiconductor device EX2 of FIG. 5 may be a cross-sectional view taken along line X-X' of FIG. 1. In FIG. 5, the same reference numerals as those of FIG. 3 denote the same members. In FIG. 5, the descriptions given above with reference to FIG. 3 are briefly given or omitted.

The semiconductor device EX2 of FIG. 5 may be a planar transistor and may be formed by a gate last process. The semiconductor device EX2 may have a symmetric structure in the first direction (the X direction) with respect to the dummy source/drain contact pattern 28. The first gate line 14a-1 and the second gate line 14b-1 of the semiconductor device EX2 may be manufactured during the same process. The first gate line 14a-1 and the second gate line 14b-1 may be referred to as trench-type gate lines formed in a gate trench in the substrate Sb.

In an embodiment, in the semiconductor device EX2, a first gate insulating layer 13-1 may be formed in a first gate trench TE1 in the substrate Sb. The first gate line 14a-1 may be formed on the first gate insulating layer 13-1 in the first gate trench TE1. The first gate line 14a-1 may include a first metal layer mg1 and a second metal layer mg2. Although the first gate line 14a-1 includes two metal layers, the first gate line 14a-1 may also include three or more metal layers.

In the semiconductor device EX2, a second gate insulating layer 15-1 may be formed in the second gate trench TE2 in the substrate Sb. The second gate line 14b-1 may be formed on the second gate insulating layer 15-1 in the second gate trench TE2. The second gate line 14b-1 may include a third metal layer mg3 and a fourth metal layer mg4.

Although the second gate line 14b-1 includes two metal layers, the second gate line 14b-1 may also include three or more metal layers. The first metal layer mg1 and the third metal layer mg3 may include at least one of TiN, TaN, TiC, and TaC. The second metal layer mg2 and the fourth metal layer mg4 may include W or A1.

Figure 6:
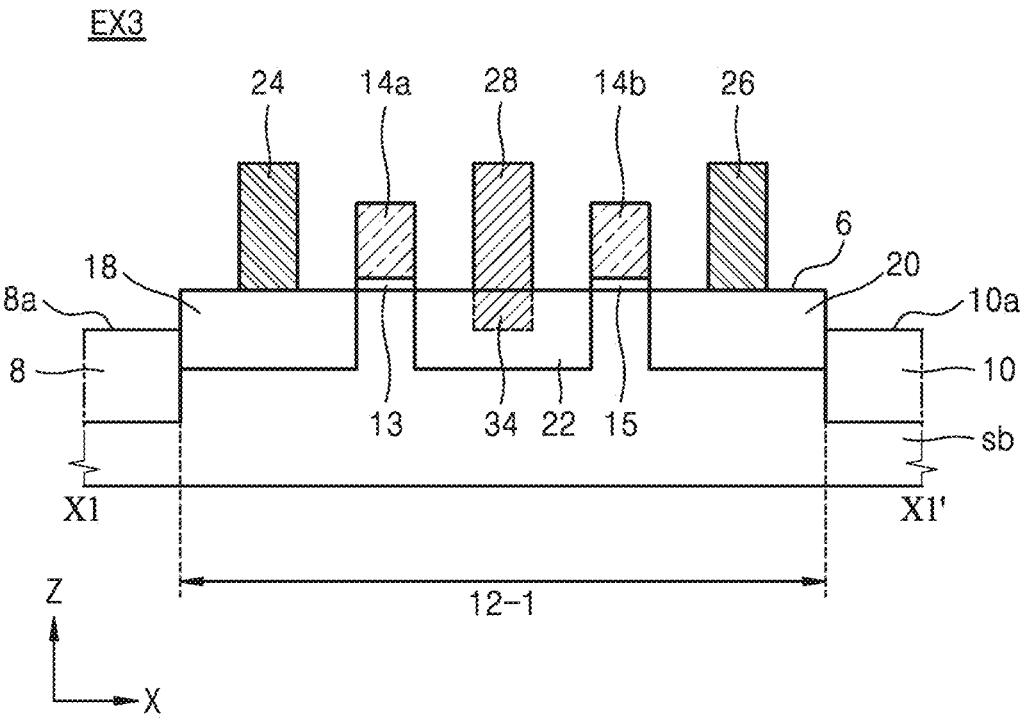
FIG. 6 is a cross-sectional view of a semiconductor device according to an embodiment of inventive concepts.

FIG. 6 is a cross-sectional view of a semiconductor device according to an embodiment of inventive concepts.

In an embodiment, a semiconductor device EX3 may be the same as the semiconductor device EX1 of FIG. 3, except that the semiconductor device EX3 includes a fin-type active region 12-1. The semiconductor device EX3 may be a cross-sectional view taken along line X-X' of FIG. 1. In FIG. 6, the same reference numerals as those in FIG. 3 denote the same members. In FIG. 6, the descriptions given above with reference to FIG. 3 are briefly given or omitted.

The semiconductor device EX3 may be a fin-type field effect transistor (FinFET) and may be formed by a gate first process. The semiconductor device EX3 may have a symmetrical structure in the first direction (the X direction) with respect to the dummy source/drain contact pattern 28. The semiconductor device EX3 may include the fin-type active region 12-1 protruding from surfaces 8a and 10a of the first and second non-active regions 8 and 10.

The surface 8a of the first non-active region 8 may be lower than the surface 6 of the substrate sb. The surface 10a of the second non-active region 10 may be lower than the surface 6 of the substrate sb. The first active contact region 18 may protrude relative to the surface 8a of the first non-active region 8. The second active contact region 20 may protrude relative to the surface 10a of the second non-active region 10.

Figure 7:
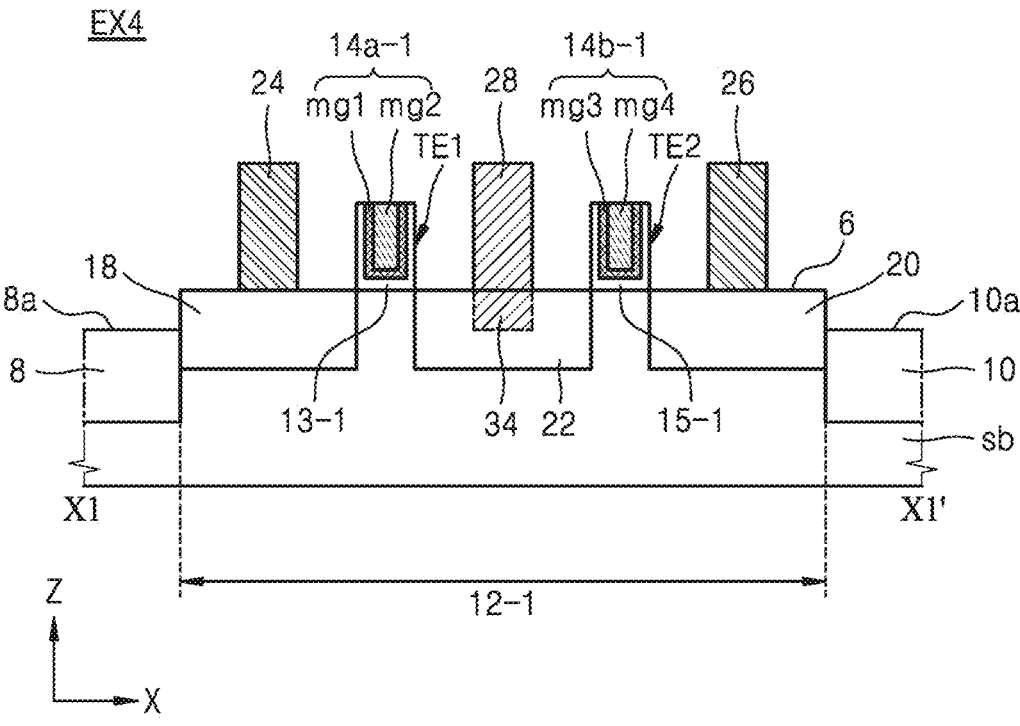
FIG. 7 is a cross-sectional view of a semiconductor device according to an embodiment of inventive concepts.

FIG. 7 is a cross-sectional view of a semiconductor device EX4 according to an embodiment of inventive concepts.

In an embodiment, the semiconductor device EX4 may be the same as that of the semiconductor device EX2 of FIG. 5, except that the semiconductor device EX4 includes the fin-type active region 12-1. The semiconductor device EX4 may be a cross-sectional view taken along line X-X' of FIG. 1. In FIG. 7, the same reference numerals as in those of FIG. 5 denote the same members. In FIG. 7, the descriptions given above with reference to FIG. 5 are briefly given or omitted.

The semiconductor device EX4 may be a FinFET and may be formed by a gate last process. The semiconductor device EX4 may have a symmetrical structure in the first direction (the X direction) with respect to the dummy source/drain contact pattern 28. The semiconductor device EX4 may include a first gate line 14a-1 and a second gate line 14b-1.

The semiconductor device EX4 may include the fin-type active region 12-1 protruding from the surfaces 8a and 10a of the first and second non-active regions 8 and 10. The first active contact region 18 may protrude relative to the surface 8a of the first non-active region 8. The second active contact region 20 may protrude relative to the surface 10a of the second non-active region 10.

Figure 8:
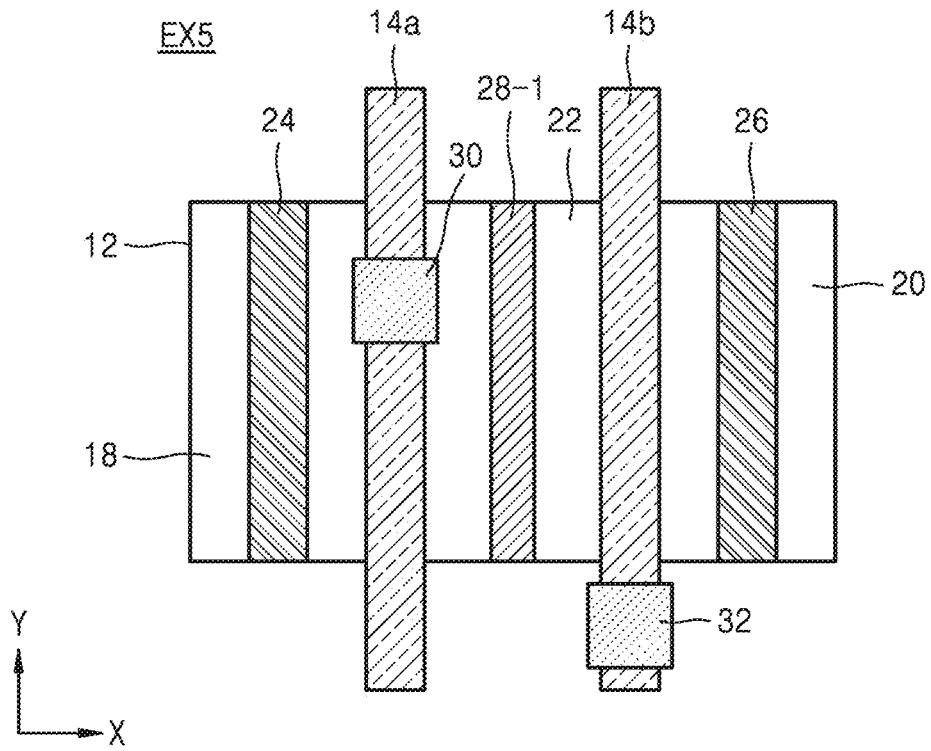
FIGS. 8 and 9 are plan views of a semiconductor device according to an embodiment of inventive concepts.
Figure 9:
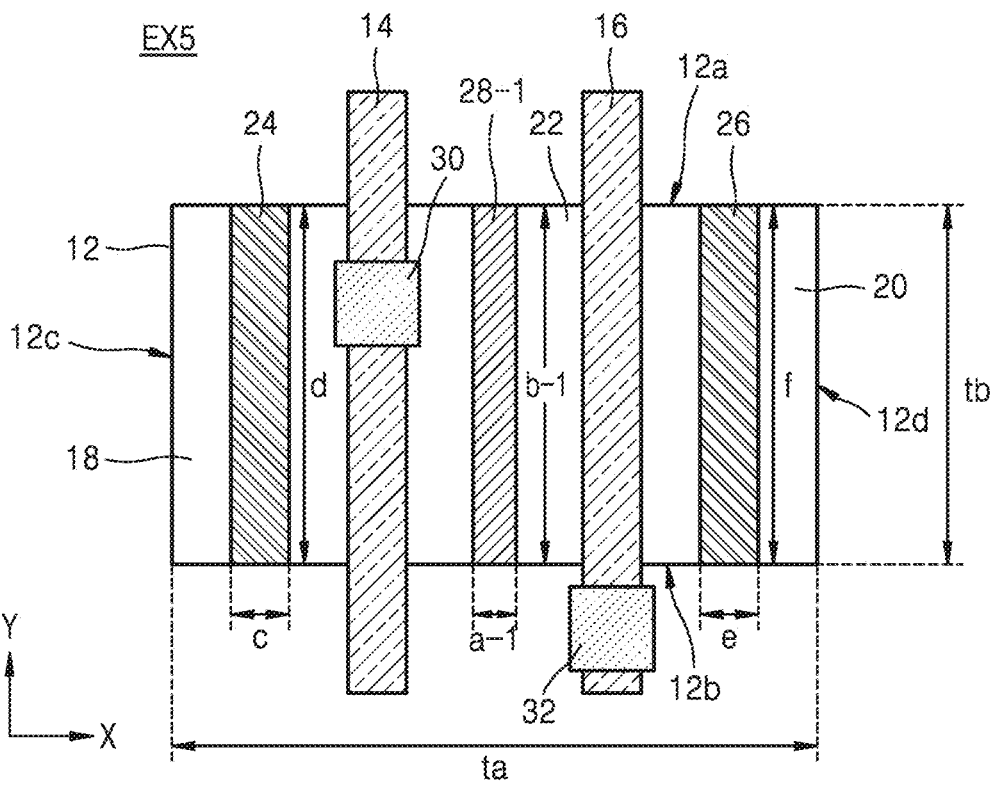

FIGS. 8 and 9 are plan views of a semiconductor device EX5 according to an embodiment of inventive concepts.

In an embodiment, the semiconductor device EX5 may be the same as the semiconductor device EX1 of FIGS. 1 and 2, except for a different arrangement and shape of a dummy source/drain contact pattern 28-1. In FIGS. 8 and 9, the same reference numerals as those of FIGS. 1 and 2 denote the same members. In FIGS. 8 and 9, the descriptions given above with reference to FIGS. 1 and 2 are briefly given or omitted.

The semiconductor device EX5 may include the active region 12, the first gate line 14a, the second gate line 14b, the first source/drain contact pattern 24, the second source/drain contact pattern 26, and the dummy source/drain contact pattern 28-1. The semiconductor device EX5 may have a symmetric structure in the first direction (the X direction) with respect to the dummy source/drain contact pattern 28-1.

The active region 12 may have the first region width to in the first direction (the X direction) and the first region length tb in the second direction (the Y direction) perpendicular to the first direction (the X direction). According to the arrangement of the first gate line 14a and the second gate line 14b, the active region 12 may be classified as a first active contact region 18, a second active contact region 20, and a dummy contact region 22.

The dummy source/drain contact pattern 28-1 may be in contact with one edge 12a and the other edge 12b of the active region 12 in the second direction (the Y direction), rather than being apart therefrom. The dummy source/drain contact pattern 28-1 may have a smaller size than that of the first source/drain contact pattern 24 and the second source/drain contact pattern 26.

The dummy source/drain contact pattern 28-1 may have a first pattern width a-1 in the first direction (the X direction) and a first pattern length b-1 in the second direction (the Y direction). The first pattern width a-1 of the dummy source/drain contact pattern 28-1 in the first direction (the X direction) may be less than the second pattern width c of the first source/drain contact pattern 24 in the first direction (the X direction) and the third pattern width e of the second source/drain contact pattern 26 in the first direction (the X direction).

The first pattern length b-1 of the dummy source/drain contact pattern 28-1 in the second direction (the Y direction) may be equal to the second pattern length d of the first source/drain contact pattern 24 in the second direction (the Y direction) and the third pattern length f of the second source/drain contact pattern 26 in the third direction (the Y direction). The second pattern length d of the first source/drain contact pattern 24 and the third pattern length f of the second source/drain contact pattern 26 may be equal to the first region length tb of the active region 12.

In some embodiments, the first pattern width a-1, the first pattern length b-1, the second pattern width c, the second pattern length d, the third pattern width e, and the third pattern length f may have a size of a few nanometers (nm) to tens of nanometers (nm).

As described above, in the semiconductor device EX5, the first pattern width a-1 of the dummy source/drain contact pattern 28-1 is configured to be less than the second pattern width c of the first source/drain contact pattern 24 and the third pattern width e of the second source/drain contact pattern 26.

Accordingly, in the semiconductor device EX5, damage to the active region 12 below the dummy source/drain contact pattern 28-1, for example, the dummy source/drain region, may be suppressed. As a result, in the semiconductor device EX5, device resistance between the first source/drain contact pattern 24 and the second source/drain contact pattern 26 may be reduced during a device operation, thereby improving device performance.

Figure 10:
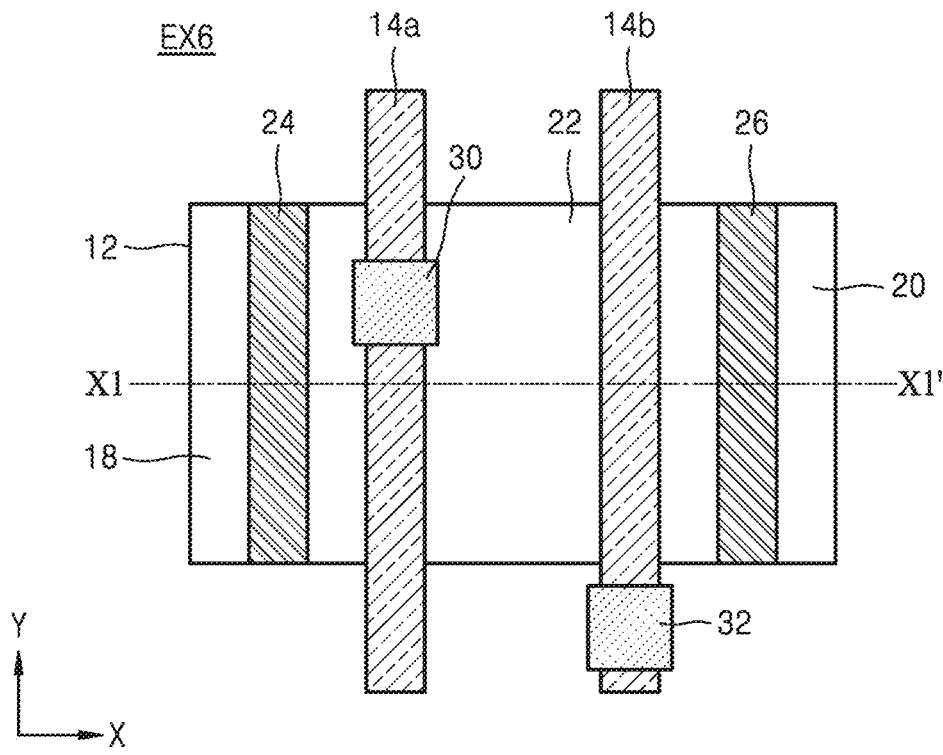
FIG. 10 is a plan view of a semiconductor device according to an embodiment of inventive concepts.

FIG. 10 is a plan view of a semiconductor device EX6 according to an embodiment of inventive concepts, and FIG.

11 is a diagram illustrating device resistance of the semiconductor device EX6 of FIG. 10.

Figure 11:
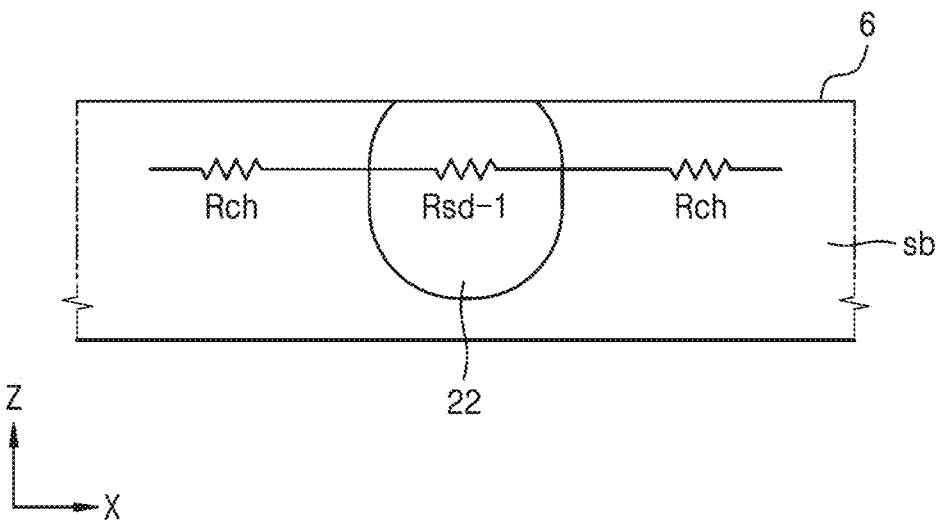
FIG. 11 is a diagram illustrating device resistance of the semiconductor device of FIG. 10.

In an embodiment, the semiconductor device EX6 may be the same as the semiconductor device EX1 of FIGS. 1 and 2, except that a dummy source/drain contact pattern is not disposed in the dummy contact region 22. In FIGS. 10 and 11, the same reference numerals as those of FIGS. 1 and 2 denote the same members. In FIGS. 10 and 11, the descriptions given above with reference to FIGS. 1 and 2 are briefly given or omitted.

The semiconductor device EX6 may include the active region 12, the first gate line 14a, the second gate line 14b, the first source/drain contact pattern 24, and the second source/drain contact pattern 26. According to the arrangement of the first gate line 14a and the second gate line 14b, the active region 12 may be classified as a first active contact region 18, a second active contact region 20, and a dummy contact region 22. A dummy source/drain contact pattern is not disposed in the dummy contact region 22.

As described above, in the semiconductor device EX6, a dummy source/drain contact pattern is not disposed in the dummy contact region 22. Accordingly, in the semiconductor device EX6, there is no damage to the dummy contact region 22, that is, the dummy source/drain region, so that resistance Rsd-1 of the dummy contact region 22 may be reduced. The resistance Rsd-1 of the dummy contact region 22 may be connected to a channel resistance Rch.

As a result, in the semiconductor device EX6 of inventive concepts, device resistance between the first active contact region 18 (or the first source/drain region) and the second active contact region 20 (or the second source/drain region) may be reduced during a device operation.

Figure 12:
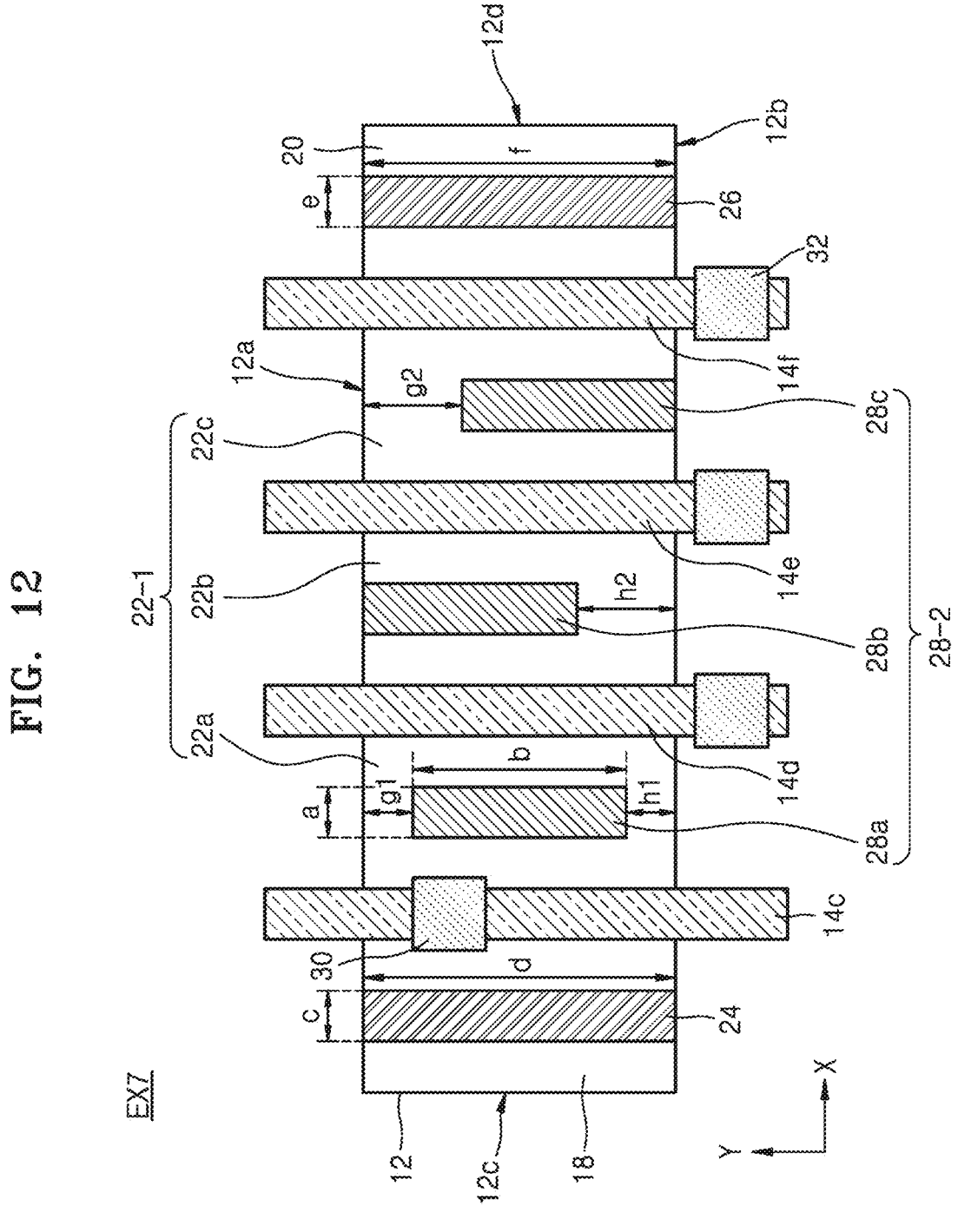
FIG. 12 is a plan view of a semiconductor device according to an embodiment of inventive concepts.

FIG. 12 is a plan view of a semiconductor device EX7 according to an embodiment of inventive concepts.

In an embodiment, the semiconductor device EX7 may be the same as the semiconductor device EX1 of FIGS. 1 and 2, except that the semiconductor device EX7 includes a plurality of gate lines 14c to 14f and an arrangement form of a dummy source/drain contact pattern 28-2 is different from that in the semiconductor device EX1 of FIGS. 1 and 2. In FIG. 12, the same reference numerals as those of FIGS. 1 and 2 denote the same members. In FIG. 12, the descriptions given above with reference to FIGS. 1 and 2 are briefly given or omitted.

The semiconductor device EX7 may include an active region 12 disposed on a substrate (sb of FIG. 3), a plurality of gate lines 14c to 14f, a first source/drain contact pattern 24, a second source/drain contact pattern 26, and a dummy source/drain contact pattern 28-2.

The gate lines 14c to 14f are apart from each other in the first direction (the X direction) in the active region 12 and extend in the second direction (the Y direction) perpendicular to the first direction (the X direction). The gate lines 14c to 14f may include a first gate line 14c on the left side in the first direction (the X direction) and a second gate line 14f on the right side.

The active region 12 may be classified as a first active contact region 18, a second active contact region 20, and a dummy contact region 22-1 according to the arrangement of the gate lines 14c to 14f. The first active contact region 18 may be disposed in the active region 12 at one side of the first gate line 14c. The second active contact region 20 may be disposed in the active region 12 at one side of the second gate line 14f.

The dummy contact region 22-1 may be disposed in the active region 12 between the gate lines 14c to 14f. The dummy contact region 22-1 may include first to third dummy contact regions 22a to 22c. A dummy source/drain contact pattern 28-2 may be disposed in the dummy contact region 22-1.

The dummy source/drain contact pattern 28-2 may include first to third dummy source/drain contact patterns 28a to 28c. The first to third dummy source/drain contact patterns 28a to 28c may be disposed in the first to third dummy contact regions 22a to 22c, respectively.

The first dummy source/drain contact pattern 28a is apart from one edge 12a of the active region 12 by a first spacing distance g1 in the second direction (−Y direction). The first dummy source/drain contact pattern 28a may be the same as the dummy source/drain contact pattern 28 of FIGS. 1 and 2. The first dummy source/drain contact pattern 28a is apart from the other edge 12b of the active region 12 by a second spacing distance h1 in the second direction (the Y direction).

The second dummy source/drain contact pattern 28b is in contact with one edge 12a of the active region 12 in the second direction (−Y direction). The second dummy source/drain contact pattern 28b may have the same size as the first dummy source/drain contact pattern 28a. The second dummy source/drain contact pattern 28b is apart from the other edge 12b of the active region 12 by a third spacing distance h2 in the second direction (the Y direction).

The third dummy source/drain contact pattern 28c is in contact with the other edge 12b of the active region 12 in the second direction (the Y direction). The third dummy source/drain contact pattern 28c is apart from one edge 12a of the active region 12 by a fourth spacing distance g2 in the second direction (−Y direction). The third dummy source/drain contact pattern 28c may have the same size as the first dummy source/drain contact pattern 28a.

As described above, the dummy source/drain contact pattern 28-2 of the semiconductor device EX7 may have a size less than the first source/drain contact pattern 24 and the second source/drain contact pattern 26. Accordingly, in the semiconductor device EX7 of inventive concepts, resistance of the dummy contact region 22-1 may be reduced by reducing the size of a dummy source/drain loss region below the dummy source/drain contact pattern 28-2.

As a result, in the semiconductor device EX7 of inventive concepts, device resistance between the first active contact region 18 (or the first source/drain region) and the second active contact region 20 (or the second source/drain region) may be reduced during a device operation.

Figure 13:
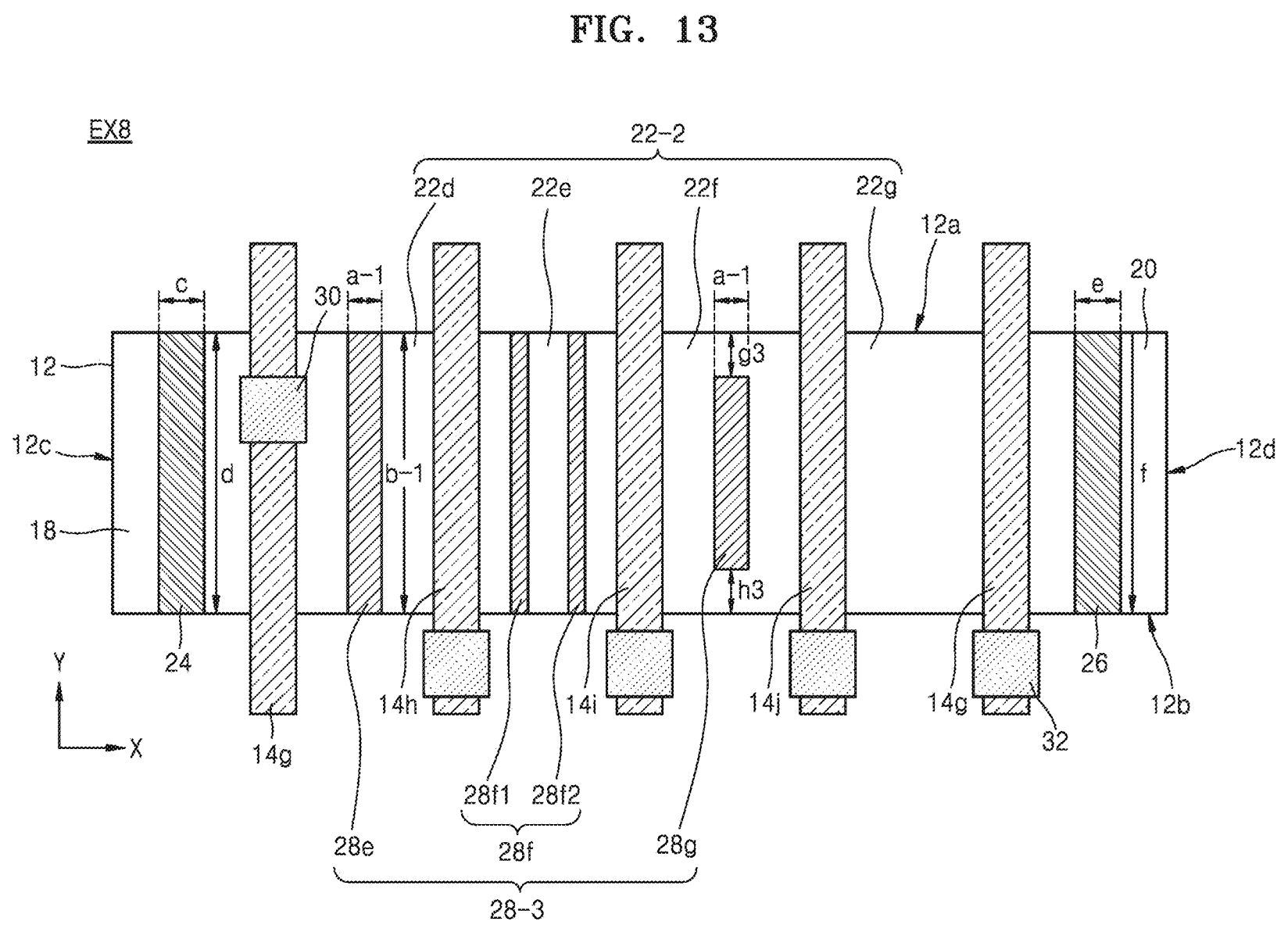

FIG. 13 is a plan view of a semiconductor device EX8 according to an embodiment of inventive concepts.

In detail, the semiconductor device EX8 may be the same as the semiconductor device EX7 of FIG. 12, except that an arrangement form or arranged shape of a dummy source/drain contact pattern 28-3 is different. In FIG. 13, the same reference numerals as those of FIG. 12 denote the same members. In FIG. 13, the descriptions given above with reference to FIG. 12 are briefly given or omitted.

The semiconductor device EX8 may include the active region 12 disposed on the substrate (sb of FIG. 3), a plurality of gate lines 14g to 14k, a first source/drain contact pattern 24, a second source/drain contact pattern 26, and a dummy source/drain contact pattern 28-3.

The gate lines 14g to 14k are apart from each other in the first direction (the X direction) in the active region 12 and extend in the second direction (the Y direction) perpendicular to the first direction (the X direction). The gate lines 14g to 14k may include a first gate line 14g on the left side in the first direction (the X direction) and a second gate line 14k on the right side.

The active region 12 may be classified as a first active contact region 18, a second active contact region 20, and a dummy contact region 22-2 according to the arrangement of the gate lines 14g to 14k. The first active contact region 18 may be disposed in the active region 12 at one side of the first gate line 14c. The second active contact region 20 may be disposed in the active region 12 at one side of the second gate line 14g.

The dummy contact region 22-2 may be disposed in the active region 12 between the gate lines 14g to 14k. The dummy contact area 22-2 may include first to fourth dummy contact areas 22d to 22f. The dummy source/drain contact pattern 28-3 may be disposed in the dummy contact region 22-2.

The dummy source/drain contact pattern 28-3 may include first to third dummy source/drain contact patterns 28e to 28g. The first to third dummy source/drain contact patterns 28e to 28g may be disposed in the first to third dummy contact regions 22d to 22f, respectively. A dummy source/drain contact pattern may not be formed in the fourth dummy contact region 22g.

The first dummy source/drain contact pattern 28e is in contact with one edge 12a and the other edge 12b of the active region 12 in the second direction (the Y direction). The first dummy source/drain contact pattern 28e may be the same as the first dummy source/drain contact pattern 28-1 of FIGS. 8 and 9. The first dummy source/drain contact pattern 28f is in contact with one edge 12a and the other edge 12b of the active region 12 in the second direction (the Y direction).

The second dummy source/drain contact pattern 28f may include a plurality of sub-dummy source/drain contact patterns 28f1 and 28f2. In FIG. 13, two sub-dummy source/drain contact patterns 28f1 and 28f2 are included, but a greater number of sub-dummy source/drain contact patterns may be included.

The third dummy source/drain contact pattern 28g is apart from one edge 12a of the active region 12 by a fifth spacing distance h3 in the second direction (−Y direction). The third dummy source/drain contact pattern 28g is apart from the other edge 12b of the active region 12 by a sixth spacing distance g3 in the second direction (the Y direction). The third dummy source/drain contact pattern 28g may have the same pattern width as that of the first dummy source/drain contact pattern 28e in the first direction (the X direction). The third dummy source/drain contact pattern 28g may have a length less than that of the first dummy source/drain contact pattern 28e in the second direction (the Y direction).

As described above, the dummy source/drain contact pattern 28-3 of the semiconductor device EX8 may have a size less than that of the first source/drain contact pattern 24 and the second source/drain contact pattern 26. Accordingly, in the semiconductor device EX8 of an embodiment of inventive concepts, resistance of the dummy contact region 22-2 may be reduced by reducing the size of a dummy source/drain loss region below the dummy source/drain contact pattern 28-3.

As a result, in the semiconductor device EX8 of an embodiment inventive concepts, device resistance between the first active contact region 18 (or the first source/drain region) and the second active contact region 20 (or the second source/drain region) may be reduced during a device operation.

Figure 14:
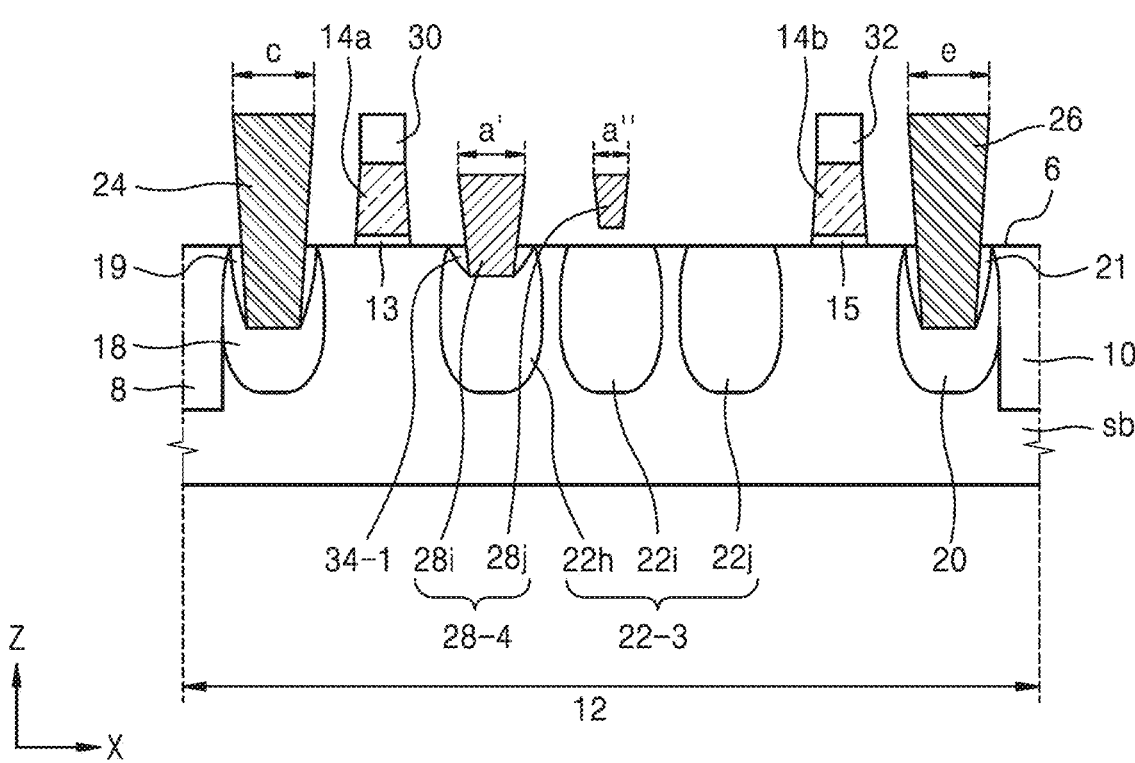
FIG. 14 is a cross-sectional view of a semiconductor device according to an embodiment of inventive concepts.

FIG. 14 is a cross-sectional view of a semiconductor device EX9 according to an embodiment of inventive concepts.

In an embodiment, the semiconductor device EX9 may be the same as the semiconductor device EX1 of FIGS. 1 to 3, except that a structure of a dummy source/drain contact pattern 28-4 and a dummy contact region 22-3 are different. In FIG. 14, the same reference numerals as those of FIGS. 1 to 3 denote the same members. In FIG. 14, the descriptions given above with reference to FIGS. 1 to 3 are briefly given or omitted.

The semiconductor device EX9 may include the active region 12, the first and second gate lines 14a and 14b, the first source/drain contact pattern 24, the second source/drain contact pattern 26, the dummy contact region 22-3, and the dummy source/drain contact pattern 28-4.

The first gate line 14a is formed on the active region 12 of the substrate sb in the Y direction. The first gate contact pattern 30 may be formed on the first gate line 14a. The second gate line 14b is formed in the active region 12 of the substrate sb to be apart from the first gate line 14a in the first direction (the X direction).

The first source/drain contact pattern 24 is disposed in the active region 12 at one side of the first gate line 14a. The first source/drain contact pattern 24 may be disposed in the first active contact region 18. When the first source/drain contact pattern 24 is formed, a source/drain loss region 19 may occur in the first active contact region 18. The first source/drain contact pattern 24 may have a second pattern width c in the first direction (the X direction).

The second source/drain contact pattern 26 is disposed in the active region 12 at one side of the second gate line 14b. The second source/drain contact pattern 26 may be disposed in the second active contact region 20. When the second source/drain contact pattern 26 is formed, a source/drain loss region 21 may occur in the second active contact region 20. The second source/drain contact pattern 26 may have a third pattern width e in the first direction (the X direction).

The dummy contact region 22-3 may be formed between the first gate line 14a and the second gate line 14b. The dummy contact region 22-3 may include first to third dummy contact regions 22h to 22i apart from each other in the first direction (the X direction).

A dummy source/drain contact pattern 28-4 is disposed in the active region 12 between the first gate line 14a and the second gate line 14b. The dummy source/drain contact pattern 28-4 may be disposed in the dummy contact region 22-3.

The dummy source/drain contact pattern 28-4 may include first and second dummy source/drain contact patterns 28i and 28j. The first dummy source/drain contact pattern 28i may be formed on the first dummy contact region 22h. When the first dummy source/drain contact pattern 28i is formed, a dummy source/drain loss region 34-1 may occur in the first dummy contact region 22h.

The first dummy source/drain contact pattern 28i may have a first sub-pattern width a' in the first direction (the X direction). The first sub-pattern width a' may be less than the third pattern width c.

The second dummy source/drain contact pattern 28j may be formed on the second dummy contact region 22i. The second dummy source/drain contact pattern 28j may not be in contact with the second dummy contact region 22i. The second dummy source/drain contact pattern 28j may have a second sub-pattern width a" in the first direction (the X direction). The second sub-pattern width a" may be less than the first sub-pattern width a' and the third pattern width c. A dummy source/drain contact pattern may not be formed on the second dummy contact region 22j.

As described above, the dummy source/drain contact pattern 28-4 of the semiconductor device EX8 may have a width less than the first source/drain contact pattern 24 and the second source/drain contact pattern 26. Accordingly, in the semiconductor device EX8 of inventive concepts, resistance of the dummy contact region 22-3 may be reduced by reducing the size of the dummy source/drain loss region 34-1 located below the dummy source/drain contact pattern 28-4.

As a result, in the semiconductor device EX8 of an embodiment of inventive concepts, device resistance between the first active contact region 18 (or the first source/drain region) and the second active contact region 20 (or the second source/drain region) may be reduced during a device operation.

Figure 15:
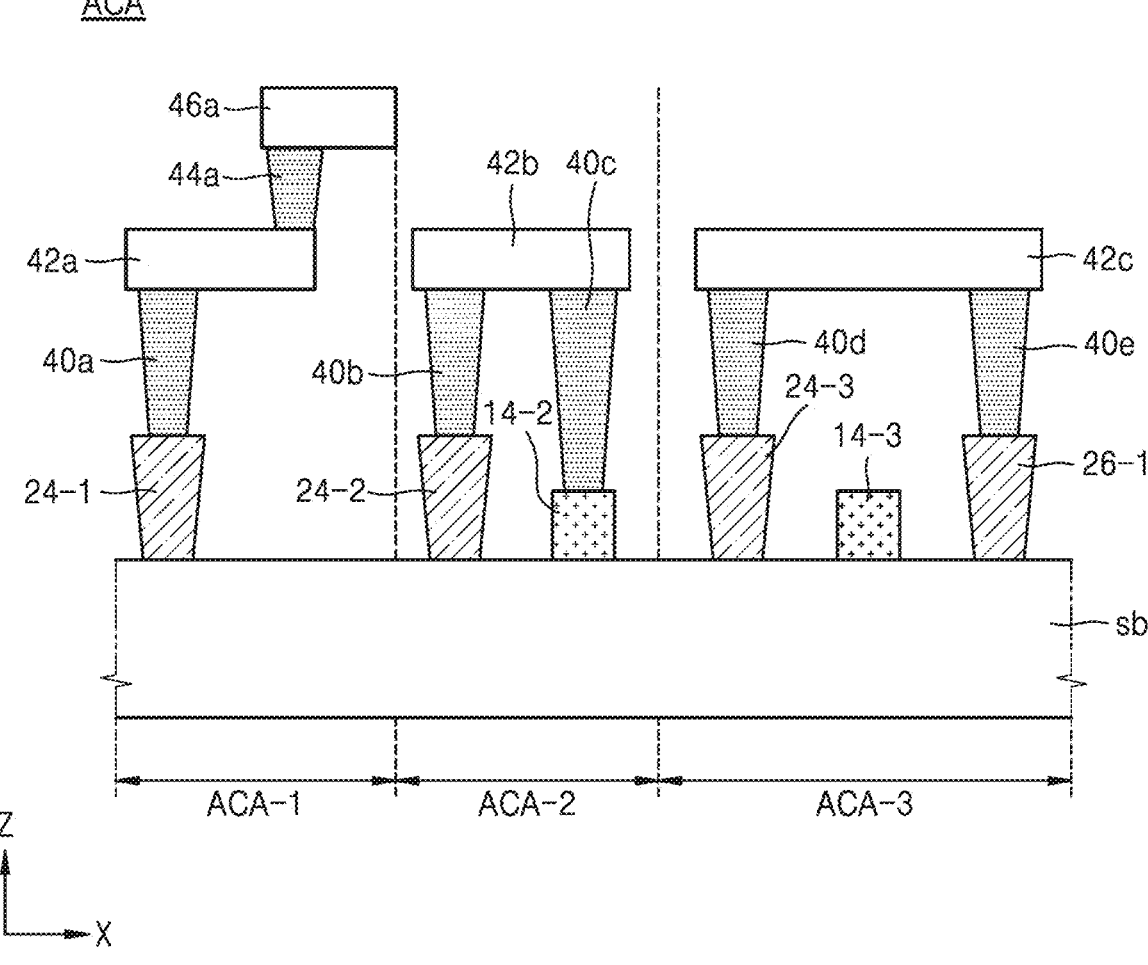
FIG. 15 is a cross-sectional view illustrating an active contact structure used in a semiconductor device according to inventive concepts.

FIG. 15 is a cross-sectional view illustrating an active contact structure ACA used in a semiconductor device according to inventive concepts.

In an embodiment, the active contact structure ACA may be used in the semiconductor devices (e.g., EX1 to EX9 described above) according to inventive concepts. The active contact structure ACA may include a first active contact structure ACA-1, a second active contact structure ACA-2, and a third active contact structure ACA-3. At least one of a first active contact structure ACA-1, a second active contact structure ACA-2, and a third active contact structure ACA-3 may be used in the semiconductor devices (e.g., EX1 to EX9 described above) of inventive concepts.

The first active contact structure ACA-1 may include a source/drain contact pattern 24-1, a first via 40*a*, a first wiring layer 42*a*, a third via 44*a*, and a second wiring layer 46*a*. The first active contact structure ACA-1 includes the source/drain contact pattern 24-1 formed on a source/drain region (e.g., 18 of FIG. 3) formed in the substrate sb. The source/drain contact pattern 24-1 may be connected to the second wiring layer 46*a* through the first via 40*a*, the first wiring layer 42*a*, and the third via 44*a*.

The second active contact structure ACA-2 may include a source/drain contact pattern 24-2, a first via 40*b*, a first wiring layer 42*b*, a second via 40*c*, and a gate line 14-2. The first active contact structure ACA-2 includes the source/drain contact pattern 24-2 formed on a source/drain region (e.g., 18 of FIG. 3) formed in the substrate sb. The source/drain contact pattern 24-2 may be connected to the gate line 14-2 through the first via 40*b*, the first wiring layer 42*b*, and the second via 40*c*.

The third active contact structure ACA-3 may include a first source/drain contact pattern 24-3, a first via 40*d*, a first wiring layer 42*c*, a second via 40*e*, a gate line 14-3, and a second source/drain contact pattern 26-1. The third active contact structure ACA-3 includes the first source/drain contact pattern 24-3 formed on the source/drain region (e.g., 18 of FIG. 3) formed on the substrate sb and the second source/drain contact pattern 26-1 formed on the source/drain region (e.g., 20 of FIG. 3) formed on the substrate sb. The first source/drain contact pattern 24-3 may be connected to the second source/drain contact pattern 26-1 through the first via 40*d*, the first wiring layer 42*c*, and the second via 40*e*.

Figure 16:
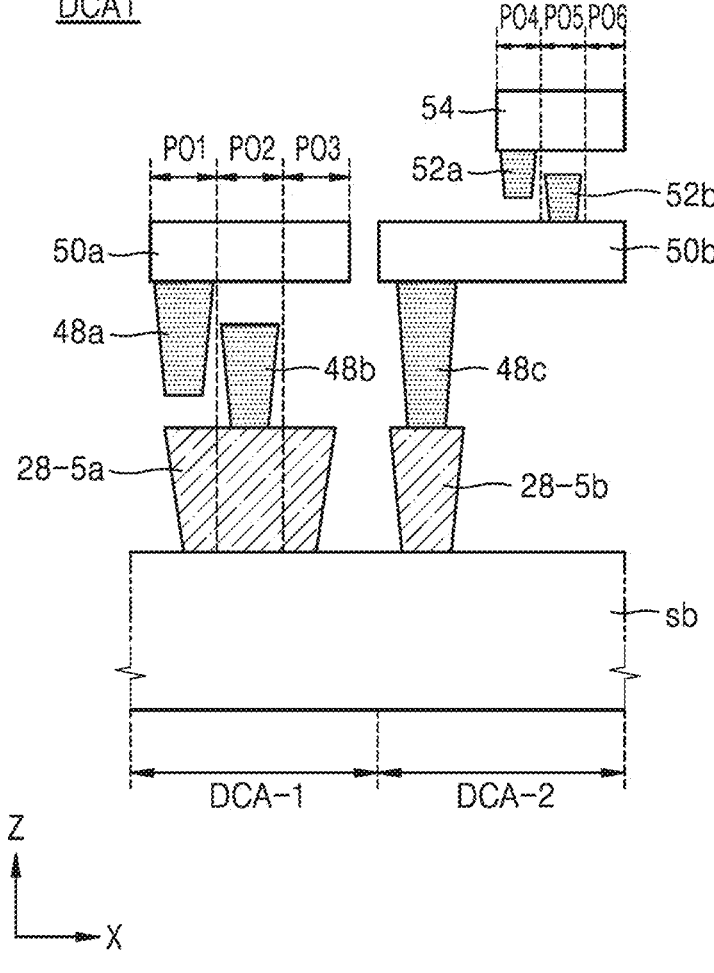
FIG. 16 is a cross-sectional view illustrating an embodiment of a dummy contact structure used in a semiconductor device according to an embodiment of inventive concepts.

FIG. 16 is a cross-sectional view illustrating an embodiment of a dummy contact structure DCA1 used in a semiconductor device according to an embodiment of inventive concepts.

In an embodiment, the dummy contact structure DCA1 may be used in the semiconductor devices (e.g., EX1 to EX9 described above) according to inventive concepts. The dummy contact structure DCA1 may include a first dummy contact structure DCA-1 and a second dummy contact structure DCA-2. At least one of the first dummy contact structure DCA-1 and the second dummy contact structure DCA-2 may be used in the semiconductor devices (e.g., EX1 to EX9 described above) according to inventive concepts.

The first dummy contact structure DCA-1 may include a dummy source/drain contact pattern 28-5*a*, a first via 48*a*, a second via 48*b*, and a first wiring layer 50*a*. The first dummy contact structure DCA-1 includes the dummy source/drain contact pattern 28-5*a* formed on the dummy source/drain region (e.g., 22 of FIG. 3) formed in the substrate sb. In a first portion PO1 of the first dummy contact structure DCA-1, the dummy source/drain contact patterns 28-5*a* may not be connected to the first via 48*a*, and the first via 48*a* may be connected to the first wiring layer 50*a*.

In a second portion PO2 of the first dummy contact structure DCA-1, the dummy source/drain contact patterns 28-5*a* may be connected to the second via 48*b*, and the second via 48*b* may not be connected to the first wiring layer 50*a*. In a third portion PO3 of the first dummy contact structure DCA-1, the dummy source/drain contact pattern 28-5*a* may not include a via and may not be connected to the first wiring layer 50*a*.

The second dummy contact structure DCA-2 may include a dummy source/drain contact patterns 28-5*b*, a first via 48*c*, a first wiring layer 50*b*, a second via 52*a*, a third via 52*b*, and a second wiring layer 54. The second dummy contact structure DCA-2 includes the dummy source/drain contact pattern 28-5*b* formed on the dummy source/drain region (e.g., 22 of FIG. 3) formed in the substrate sb. In a fourth portion PO4 of the second dummy contact structure DCA-2, the dummy source/drain contact pattern 28-5*b* may be connected to the first wiring layer 50*b* through the first via 48*c*, and the first wiring layer 50*b* may not be connected to the second via 52*a*.

In a fifth portion PO5 of the second dummy contact structure DCA-1, the dummy source/drain contact pattern 28-5*b* may be connected to the first wiring layer 50*b* through the first via 48*c*, and the first wiring layer 50*b* may be connected to the third via 52*b*.

In a sixth portion PO6 of the second dummy contact structure DCA-2, the dummy source/drain contact pattern 28-5*b* may be connected to the first wiring layer 50*b* through the first via 48*c*, and the first wiring layer 50*b* may not be connected to the second wiring layer 54.

Figure 17:
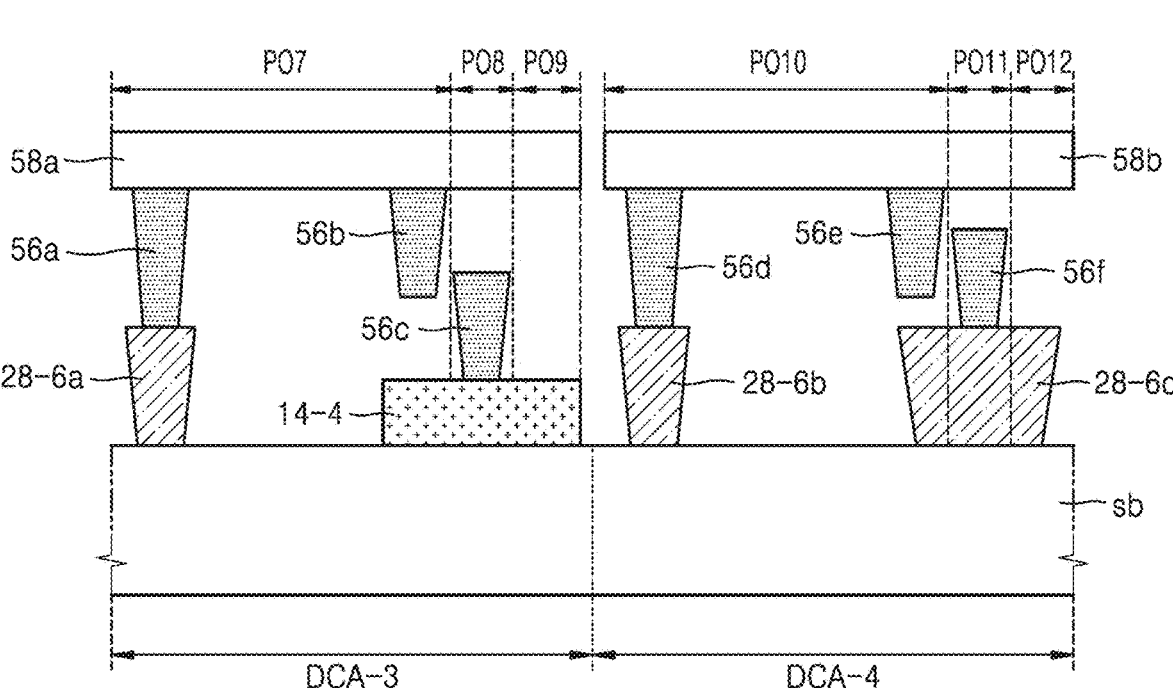
FIG. 17 is a cross-sectional view illustrating an embodiment of a dummy contact structure used in a semiconductor device according to an embodiment of inventive concepts.

FIG. 17 is a cross-sectional view illustrating an embodiment of a dummy contact structure DCA2 used in a semiconductor device according to inventive concepts.

In an embodiment, the dummy contact structure DCA2 may be used in the semiconductor devices (e.g., EX1 to EX9 described above) according to inventive concepts. The dummy contact structure DCA2 may include a third dummy contact structure DCA-3 and a fourth dummy contact structure DCA-4. At least one of the third dummy contact structure DCA-3 and the fourth dummy contact structure DCA-4 may be used in the semiconductor devices (e.g., EX1 to EX9 described above) according to inventive concepts.

The third dummy contact structure DCA-3 may include a dummy source/drain contact pattern 28-6*a*, a first via 56*a*, a second via 56*b*, a third via 56*c*, a first wiring layer 58*a*, and a gate line 14-4. The third dummy contact structure DCA-3 includes the dummy source/drain contact pattern 28-6*a* formed on the dummy source/drain region (e.g., 22 of FIG. 3) formed in the substrate sb.

In a seventh portion PO7 of the third dummy contact structure DCA-3, the dummy source/drain contact patterns 28-6*a* may be connected to the first wiring layer 58*a* through the first via 56a, and the second via 56b located below the first wiring layer 58a may not be connected to the gate line 14-4.

In an eighth portion PO8 of the third dummy contact structure DCA-3, the dummy source/drain contact patterns 28—may be connected to the first wiring layer 58a through the first vias 56a, and the first wiring layer 58a may not be connected to the third via 56c on the gate line 14-4.

In a ninth portion PO9 of the third dummy contact structure DCA-3, the dummy source/drain contact pattern 28-6a may be connected to the first wiring layer 58a through the first vias 56a, and the first wiring layer 58a may not be connected to the gate line 14-4.

The fourth dummy contact structure DCA-4 may include a first dummy source/drain contact pattern 28-6b, a first via 56d, a second via 56e, a third via 56f, a first wiring layer 58b, and a second dummy source/drain contact pattern 28-6c. The fourth dummy contact structure DCA-4 includes the first dummy source/drain contact pattern 28-6b formed on the dummy source/drain region (e.g., 22 of FIG. 3) formed in the substrate sb.

In a tenth portion PO10 of the fourth dummy contact structure DCA-4, the first dummy source/drain contact patterns 28-6b may be connected to the first wiring layer 58b through the first vias 56d, and the second via 56e located below the first wiring layer 58b may not be connected to the second dummy source/drain contact pattern 28-6c.

In an eleventh portion PO11 of the fourth dummy contact structure DCA-4, the first dummy source/drain contact patterns 28-6b may be connected to the first wiring layer 58b through the first via 56d, and the first wiring layer 58b may not be connected to the third via 58f on the second dummy source/drain contact pattern 28-6c.

In a twelfth portion PO12 of the fourth dummy contact structure DCA-4, the first dummy source/drain contact patterns 28-6b may be connected to the first wiring layer 58b through the first via 56d, and the first wiring layer 58b may not be connected to the second dummy source/drain contact pattern 28-6c.

Figure 18:
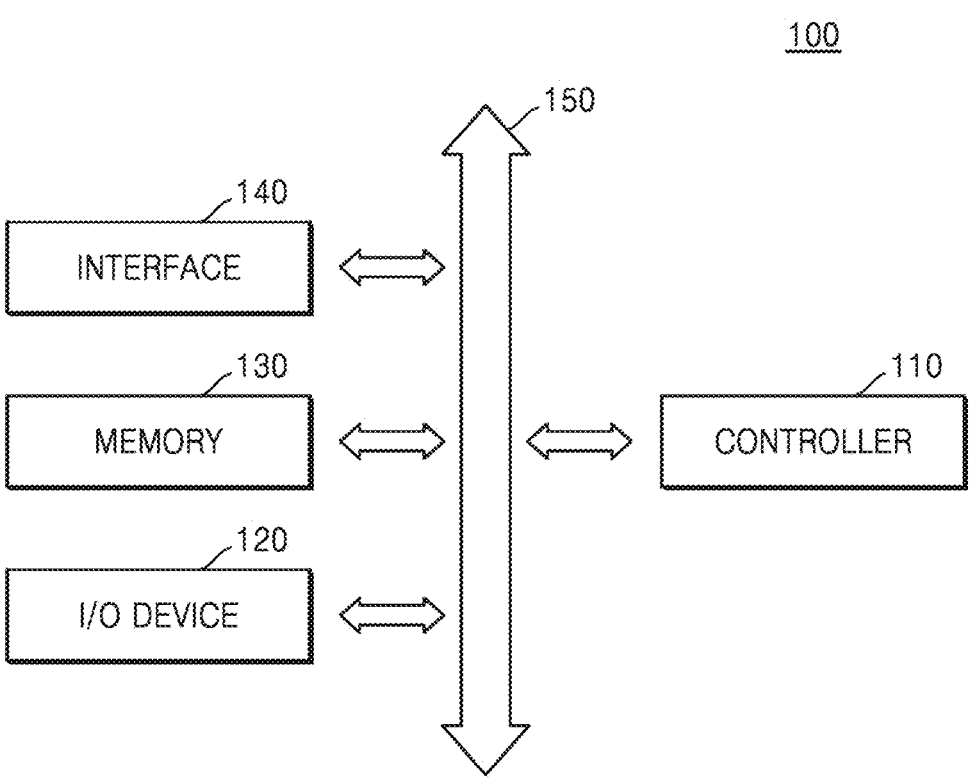
FIG. 18 is a schematic diagram illustrating an electronic system including a semiconductor device according to an embodiment of inventive concepts.

FIG. 18 is a schematic diagram illustrating an electronic system 100 including a semiconductor device according to an embodiment of inventive concepts.

In an embodiment, the electronic system 100 may include a controller 110, an input/output (I/O) device 120, a memory 130, and an interface 140. The electronic system 100 may be a mobile system or a system for transmitting or receiving information. The mobile system may be a personal digital assistant (PDA), a portable computer, a web tablet, a wireless phone, a mobile phone, a digital music player, or a memory card.

The controller 110 may serve to execute a program and control the system 100. The controller 110 may include a semiconductor device according to an embodiment of inventive concepts. The controller 110 may be, for example, a microprocessor, a digital signal processor, a microcontroller, or a similar device.

The I/O device 120 may be used to input or output data of the electronic system 100. The electronic system 100 may be connected to an external device such as a personal computer or a network using the I/O device 120 to exchange data with the external device. The I/O device 120 may be, for example, a keypad, a keyboard, or a display.

The memory 130 may store codes and/or data for an operation of the controller 110, and/or store data processed by the controller 110. The memory 130 may include the semiconductor devices EX1 to EX9 according to an embodiment of inventive concepts. The interface 140 may be a data transmission path between the electronic system 100 and another external device. The controller 110, the I/O device 120, the memory 130, and the interface 140 may communicate with each other through a bus 150.

For example, the electronic system 100 may be used in mobile phones, MP3 players, navigation systems, portable multimedia players (PMPs), solid state disks (SSDs), or household appliances.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While some embodiments of inventive concepts have been particularly shown and described, it will be understood that various changes in form and details may be made therein without departing from the spirit and scope of the following claims.

What is claimed is:

1. A semiconductor device comprising:
a substrate including an active region;
a first gate line and a second gate line in the active region, the first gate line and the second gate line being spaced apart from each other in a first direction and extending in a second direction, the second direction crossing the first direction;
a first source/drain contact pattern in the active region at one side of the first gate line;
a second source/drain contact pattern in the active region at one side of the second gate line; and
a dummy source/drain contact pattern in the active region between the first gate line and the second gate line, wherein
a greatest length of the dummy source/drain contact pattern in the second direction is less than a greatest length of the first source/drain contact pattern in the second direction and a greatest length of the second source/drain contact pattern in the second direction, and
wherein the dummy source/drain contact pattern, the first source/drain contact pattern, and the second source/drain contact pattern have substantially quadrilateral shapes in a cross-sectional view.

2. The semiconductor device of claim 1, wherein the dummy source/drain contact pattern is spaced apart in the second direction from a first edge of the active region, a second edge of the active region, or both the first edge of the active region and the second edge of the active region.

3. The semiconductor device of claim 1, wherein
the dummy source/drain contact pattern includes a plurality of dummy source/drain contact patterns, and
sizes of the plurality of dummy source/drain contact patterns are less than a size of the first source/drain contact pattern and a size of the second source/drain contact pattern.

4. The semiconductor device of claim 1, wherein
the active region includes a dummy contact region between the first gate line and the second gate line,
the dummy contact region includes a dummy source/drain region in the substrate, and
the active region includes a dummy source/drain loss region in the dummy source/drain region below the dummy source/drain contact pattern.

5. The semiconductor device of claim 1, wherein
the dummy source/drain contact pattern has a first pattern width in the first direction,
the first source/drain contact pattern has a second pattern width in the first direction,
the second source/drain contact pattern has a third pattern width in the first direction, and
the first pattern width is equal to the second pattern width and the third pattern width.

6. The semiconductor device of claim 5, wherein
the active region has a first region width in the first direction and a first region length in the second direction,
the greatest length of the dummy source/drain contact pattern in the second direction is less than the first region length, and
the greatest lengths of the first source/drain contact pattern and the second source/drain contact pattern in the second direction are equal to the first region length.

7. The semiconductor device of claim 1, wherein
the dummy source/drain contact pattern has a first pattern width in the first direction,
the first source/drain contact pattern has a second pattern width in the first direction,
the second source/drain contact pattern has a third pattern width in the first direction, and
the first pattern width is less than the second pattern width and the third pattern width.

8. The semiconductor device of claim 7, wherein
the active region has a first region width in the first direction and a first region length in the second direction,
the greatest length of the dummy source/drain contact pattern in the second direction is less than the first region length, and
the greatest lengths of the first source/drain contact pattern and the second source/drain contact pattern in the second direction are equal to the first region length.

9. The semiconductor device of claim 1, wherein the dummy source/drain contact pattern includes a plurality of sub-dummy source/drain contact patterns spaced apart from each other.

10. The semiconductor device of claim 1, wherein the first gate line and the second gate line include a planar gate line or a trench-type gate line.

11. The semiconductor device of claim 1, wherein
the active region includes a fin-type active region, and
the first gate line and the second gate line include a planar gate line or a trench-type gate line.

12. A semiconductor device comprising:
a substrate including an active region having a first region width in a first direction and a first region length in a second direction, the second direction perpendicular to the first direction, wherein the active region comprises a continuous region bounded laterally by insulating regions,
the active region including a first active contact region, a second active contact region, and a dummy contact region between the first active contact region and the second active contact region;
a first gate line and a second gate line extending in the second direction in the active region, the second gate line spaced apart from the first gate line in the first direction,
the first gate line and the second gate line in the active region with the first active contact region at one side of the first gate line, the second active contact region at one side of the second gate line, and the dummy contact region between the first gate line and the second gate line;
a first source/drain contact pattern in the first active contact region, the first source/drain contact pattern being spaced apart from the first gate line in the first direction;
a second source/drain contact pattern in the second active contact region, the second source/drain contact pattern being spaced apart from the second gate line in the first direction; and
a dummy source/drain contact pattern in the dummy contact region between the first gate line and the second gate line,
wherein the first source/drain contact pattern and the second source/drain contact pattern each extend to a first edge of the active region and a second edge of the active region, wherein the first edge and the second edge are opposite edges in the second direction, and
wherein the dummy source/drain contact pattern is spaced apart from at least one of the first edge or the second edge in the second direction.

13. The semiconductor device of claim 12, wherein the first active contact region and the second active contact region include a source/drain region in the substrate.

14. The semiconductor device of claim 12, wherein
the first source/drain contact pattern has a second pattern width in the first direction and a second pattern length in the second direction,
the second source/drain contact pattern has a third pattern width in the first direction and a third pattern length in the second direction,
the first region length is equal to the second pattern length and the third pattern length, and
the first region width is greater than the second pattern width and the third pattern width.

15. The semiconductor device of claim 12, wherein
the dummy contact region includes a dummy source/drain region in the substrate, and
a dummy source/drain loss region is not formed in the dummy source/drain region.

16. A semiconductor device comprising:
a substrate including an active region, the active region including a first active contact region, a second active contact region, and a plurality of dummy contact regions in the active region;
a plurality of gate lines spaced apart from each other in a first direction in the active region, the plurality of gate lines extending in a second direction perpendicular to the first direction in the active region, the plurality of gate lines including a first gate line and a second gate line,
the plurality of gate lines in the active region with the first active contact region at one side of the first gate line and the second active contact region at one side of the second gate line, and the plurality of dummy contact regions in the active region between the plurality of gate lines;

a first source/drain contact pattern in the first active contact region;

a second source/drain contact pattern in the second active contact region; and a plurality of dummy source/drain contact patterns in at least one of the plurality of dummy contact regions, wherein greatest lengths of the plurality of dummy source/drain contact patterns in the second direction are less than a greatest length of the first source/drain contact pattern in the second direction and a greatest length of the second source/drain contact pattern in the second direction, and wherein the plurality of dummy source/drain contact patterns, the first source/drain contact pattern, and the second source/drain contact pattern have substantially quadrilateral shapes in a cross-sectional view.

17. The semiconductor device of claim 16, wherein the plurality of dummy source/drain contact patterns are spaced apart in the second direction from a first edge of the active region, a second edge of the active region, or both the first edge of the active region and the second edge of the active region.

18. The semiconductor device of claim 16, wherein the plurality of dummy source/drain contact patterns have different pattern widths in the first direction.

19. The semiconductor device of claim 16, wherein the plurality of dummy source/drain contact patterns have first pattern widths in the first direction, the first source/drain contact pattern has a second pattern width in the first direction, the second source/drain contact pattern has a third pattern width in the first direction, and each of the first pattern widths is equal to the second pattern width and the third pattern width.

20. The semiconductor device of claim 16, wherein the plurality of dummy source/drain contact patterns have first pattern widths in the first direction, the first source/drain contact pattern has a second pattern width in the first direction, the second source/drain contact pattern has a third pattern width in the first direction, and each of the first pattern widths is less than the second pattern width and the third pattern width.

* * * * *